(12) United States Patent
Maeda et al.

(10) Patent No.: US 7,907,237 B2
(45) Date of Patent: Mar. 15, 2011

(54) PATTERN-FORMED SUBSTRATE, COLOR FILTER AND LIQUID CRYSTAL DISPLAY EMPLOYING THE COLOR FILTER

(75) Inventors: Tadatoshi Maeda, Tokyo (JP); Junichi Kaminaga, Tokyo (JP); Teruhiko Kai, Tokyo (JP); Naganori Ohama, Tokyo (JP); Madoka Ozawa, Tokyo (JP)

(73) Assignee: Toppan Printing Co., Ltd. (JP)

( * ) Notice: Subject to any disclaimer, the term of this patent is extended or adjusted under 35 U.S.C. 154(b) by 0 days.

(21) Appl. No.: 12/717,847

(22) Filed: Mar. 4, 2010

(65) Prior Publication Data
US 2010/0195029 A1   Aug. 5, 2010

Related U.S. Application Data

(63) Continuation of application No. PCT/JP2008/065400, filed on Aug. 28, 2008.

(30) Foreign Application Priority Data

Sep. 7, 2007 (JP) .................................. 2007-232495

(51) Int. Cl.
G02F 1/1335 (2006.01)
G02F 1/1333 (2006.01)
(52) U.S. Cl. ........................................ 349/106; 349/110
(58) Field of Classification Search .......... 349/106–109, 349/187
See application file for complete search history.

(56) References Cited

U.S. PATENT DOCUMENTS
2005/0057712 A1* 3/2005 Katagami et al. ............. 349/114

FOREIGN PATENT DOCUMENTS
| JP | 2004-288403 | 10/2004 |
| JP | 2005-339810 | 12/2005 |
| JP | 2007-188862 | 7/2007 |
| JP | 2008-20517 | 1/2008 |

* cited by examiner

Primary Examiner — David Nelms
Assistant Examiner — David Y Chung
(74) Attorney, Agent, or Firm — Squire, Sanders & Dempsey (US) LLP

(57) ABSTRACT

The present invention provides a pattern formation substrate provided with a transparent substrate, a partition pattern formed on the transparent substrate in an approximately orthogonal grid shape, and a coloring pattern of plural colors, provided in an opening partitioned off with the partition pattern. The coloring pattern is formed in an approximately stripe shape in each of the colors, the partition pattern is composed of an X-direction partition pattern provided in an approximately orthogonal direction to a longitudinal direction of the stripe of the coloring pattern and a Y-direction partition pattern provided in an approximately parallel direction to the longitudinal direction of the stripe of the coloring pattern, and an average film thickness of the X-direction partition pattern is smaller than that of the Y-direction partition pattern.

7 Claims, 8 Drawing Sheets

PATTERN-FORMED SUBSTRATE, COLOR FILTER AND LIQUID CRYSTAL DISPLAY EMPLOYING THE COLOR FILTER

TECHNICAL FIELD

The present invention relates to a pattern formation substrate used for a color display device, a color filter using this pattern formation substrate and a liquid crystal display device provided therewith. In particular, the present invention relates to a pattern formation substrate and a color filter which are produced by filling colored ink into an opening partitioned off with a partition pattern formed on the substrate, and a liquid crystal display device using the same.

The present application claims the benefit of priority from the prior Japanese Patent Application No. 2007-232495, filed on Sep. 7, 2007, the entire contents of which are incorporated herein by reference.

BACKGROUND ART

In recent years, an inkjet printing system has been proposed as a method for producing a color filter used for a color display device such as a color liquid crystal display (for example, refer to Patent Documents 1 and 2).

For example, it is disclosed in these proposals that a black matrix containing a fluorine-containing compound and/or a silicon-containing compound is regarded as a partition pattern (partition wall) for preventing ink bleeding in the coloring process and color mixture caused by the mixing of ink between adjacent pixels.

Various shapes such as a grid pattern partitioned off in each pixel and a stripe pattern are known as the partition pattern.

However, in the case where ink is filled by an inkjet method into an opening of the partition pattern formed in the grid shape, a nozzle in charge is determined for each opening, so that the problem is that variations in chromaticity of a coloring pattern in each opening are caused by variations in discharge amount in each nozzle. On the other hand, the problem is that the stripe pattern is not so high in light blockability and inferior to the grid pattern in terms of contrast.

In order to solve the problem of pixel shape caused by the bias of ink during the drying of ink, the recess forming process for forming a recess in a non-display portion and a method for discharging ink so that ink falling in the recess in the non-display portion and ink falling in a display portion continue are known (Patent Document 3). However, according to Patent Document 3, the pixel shape including the partition is restricted; for example, when the partition and the recess are formed in the grid shape to form a coloring pattern by an inkjet method, a possibility is brought that different inks are so adjacent as to cause color mixture.

Therefore, in view of the problems as described above, the present invention is intended for improving the pixel shape of a coloring pattern in each opening to provide a color filter in the stripe shape or the grid shape without any color shading.

Patent Document 1: Japanese Patent Application Laid-Open No. 7-35915
Patent Document 2: Japanese Patent Application Laid-Open No. 7-35917
Patent Document 3: Japanese Patent Application Laid-Open No. 2005-157067

SUMMARY OF THE INVENTION

The pattern formation substrate according to a first aspect of the present invention is a pattern formation substrate provided with a transparent substrate, a partition pattern formed on the transparent substrate in an approximately orthogonal grid shape, and a coloring pattern of plural colors, provided in an opening partitioned off with the partition pattern, wherein the coloring pattern is formed in an approximately stripe shape in each of the colors, the partition pattern is composed of an X-direction partition pattern provided in an approximately orthogonal direction to a longitudinal direction of the stripe of the coloring pattern and a Y-direction partition pattern provided in an approximately parallel direction to the longitudinal direction of the stripe of the coloring pattern, and an average film thickness of at least part of the X-direction partition pattern is smaller than an average film thickness of the Y-direction partition pattern.

Also, an average film thickness of at least part of the X-direction partition pattern is preferably 40% to 90% of an average film thickness of the Y-direction partition pattern.

According to such a pattern formation substrate, the film thickness of the X-direction partition pattern in the partition pattern becomes comparatively small so that ink discharged into an opening (pixel) adjacent to this X-direction partition pattern mixes. Thus, the ink amount in adjacent openings over this X-direction partition pattern is adjusted so as to become equal. Consequently, even though the ink feed rate varies in each opening, the ink flows on the X-direction partition pattern with thin film thickness to mutually cause the leveling function, so that a pattern formation substrate in which variations in the filled ink amount in each opening are restrained may be obtained. Then, in the case of forming the coloring pattern by discharging colored ink containing coloring pigment into the opening, variations in chromaticity of the filled coloring pattern in each opening may be restrained to allow a color filter with no color shading and uniform chromaticity.

According to the invention, more ink is distributed on the whole substrate in the drying process, so that the problem of pixel shape caused by the bias of ink during the drying of ink may be also alleviated.

The partition pattern may contain a light blocking agent. This may provide a pattern formation substrate in which the partition pattern functions as a black matrix in a grid shape (no disconnected regions in both X direction and Y direction).

The optical density of the X-direction partition pattern may be determined at 2 or more. This may provide a pattern formation substrate having the partition pattern with higher light blockability and favorable contrast.

At least the Y-direction partition pattern in the partition pattern may contain an ink-repellent material. Thus, with regard to at least the Y-direction partition pattern in the partition pattern, the function of partitioning ink off is strengthened so that the problem of color mixture caused by inks of different colors over the Y-direction partition pattern may be alleviated.

The Y-direction partition pattern may put out above the X-direction partition pattern. Thus, by any chance, even in the case where color mixture is caused over the Y-direction partition pattern, the ratio of ink contaminated by the color mixture further contaminating ink of the same color over the X-direction partition pattern is decreased, so that a color filter with the color mixture corrected by comparatively simple repair may be provided.

There is also provided a pattern formation substrate provided with a transparent substrate, a partition pattern formed on the transparent substrate in an approximately orthogonal grid shape, and a coloring pattern of plural colors, provided in an opening partitioned off with the partition pattern, wherein the coloring pattern is formed in an approximately stripe shape in each of the colors, the partition pattern is composed of an X-direction partition pattern provided in an approximately orthogonal direction to a longitudinal direction of the stripe of the coloring pattern and a Y-direction partition pattern provided in an approximately parallel direction to the longitudinal direction of the stripe of the coloring pattern, and the X-direction partition pattern is composed of a first area in which an average film thickness is approximately the same as that of the Y-direction partition pattern and a second area in which an average film thickness is smaller than that of the Y-direction partition pattern (preferably, 40% to 90%).

The second area in which the film thickness of the X-direction partition pattern is comparatively small is included in the partition pattern, so that ink discharged into an opening (pixel) adjacent to this X-direction partition pattern is mixed (FIG. 1A). Thus, the ink amounts in adjacent openings over this X-direction partition pattern are adjusted to be equal. Consequently, even though the ink feed rate varies in each opening, the ink flows on the second area of the X-direction partition pattern with thin film thickness to mutually cause the leveling function, so that a pattern formation substrate in which variations in the filled ink amount in each opening are restrained may be obtained. Then, in the case of forming the coloring pattern by discharging colored ink containing coloring pigment into the opening, variations in chromaticity of the filled coloring pattern in each opening may be restrained to allow a color filter with no color shading and uniform chromaticity.

According to this, more ink is distributed on the whole substrate in the drying process, so that the problem of pixel shape caused by the bias of ink during the drying of ink may be also alleviated.

Further simultaneously, in the present invention, all of the X-direction partition pattern is not determined to be the second area, but the first area in which an average film thickness is approximately the same as that of the Y-direction partition pattern (FIG. 1B) is included. Therefore, by any chance, even in the case where color mixture is caused over the Y-direction partition pattern, there is the effect of decreasing the ratio of ink contaminated by the color mixture further contaminating ink of the same color over the X-direction partition pattern. Thus, a pattern formation substrate and a color filter with the color mixture corrected by comparatively simple repair may be provided.

There is also provided a pattern formation substrate provided with a transparent substrate, a partition pattern formed on the transparent substrate in an approximately orthogonal grid shape, and a coloring pattern of plural colors, provided in an opening partitioned off with the partition pattern, wherein the coloring pattern is formed in an approximately stripe shape in each of the colors, the partition pattern is composed of an X-direction partition pattern provided in an approximately orthogonal direction to a longitudinal direction of the stripe of the coloring pattern and a Y-direction partition pattern provided in an approximately parallel direction to the longitudinal direction of the stripe of the coloring pattern, the X-direction partition pattern is composed of a first area in which an average film thickness is approximately the same as that of the Y-direction partition pattern and a second area in which an average film thickness is smaller than that of the Y-direction partition pattern (preferably, 40% to 90%), the second area is provided in an area close to a selected one Y-direction partition pattern of two Y-direction partition patterns adjacent to the X-direction partition pattern, and the selection of the Y-direction partition pattern is alternately performed along the longitudinal direction of the coloring pattern.

According to this, the same effect as the above is obtained. Furthermore, the X-direction partition pattern in the second area is alternately provided along the longitudinal direction of the coloring pattern (FIG. 1C), so that, by any chance, even in the case where color mixture is caused over the Y-direction partition pattern and ink contaminated by the color mixture further contaminates adjacent ink of the same color over the X-direction partition pattern, the effect of decreasing the ratio of contaminating further adjacent ink of the same color is obtained. Thus, a pattern formation substrate and a color filter with the color mixture correctable by comparatively simple repair may be provided.

In a side adjacent to a pixel, the ratio of the length of the first area in the whole X-direction partition pattern may be determined at 50% to 90%. According to this, the ratio of the length of the first area in the whole X-direction partition pattern is 90% or less, so that the second area in which the film thickness of the X-direction partition pattern is comparatively small is included. As a result, ink discharged into an opening (pixel) adjacent to this X-direction partition pattern is mixed more certainly to bring more reliable effect of leveling. According to the invention, the ratio of the length of the first area in the whole X-direction partition pattern is 50% or more, so that, by any chance, even in the case where color mixture is caused over the Y-direction partition pattern, the color mixture may be prevented from further expanding.

The partition pattern may contain a light blocking agent. This invention may provide a pattern formation substrate in which the partition pattern functions as a black matrix.

The optical density of the X-direction partition pattern 100 may be 2 or more. This may provide a pattern formation substrate having the partition pattern with high light blockability and more favorable contrast.

The Y-direction partition pattern 200 may contain an ink-repellent material. Thus, with regard to at least the Y-direction partition pattern in the partition pattern, the function of partitioning ink off is strengthened so that the problem of color mixture caused by inks of different colors over the Y-direction partition pattern may be alleviated.

The above pattern formation substrate may be applied to a color filter in which the coloring pattern is formed by coloring pigment. This may provide a color filter with both color shading and color mixture decreased. In the case where the coloring pigment content in ink is large, the coloring pigment occasionally exists on a portion of the X-direction partition pattern where an average film thickness is small.

A second aspect of the present invention provides a liquid crystal display device provided with this color filter. This liquid crystal display device is low in color shading and improved in pixel quality.

DESCRIPTION OF REFERENCE NUMERALS

Figure 1A:
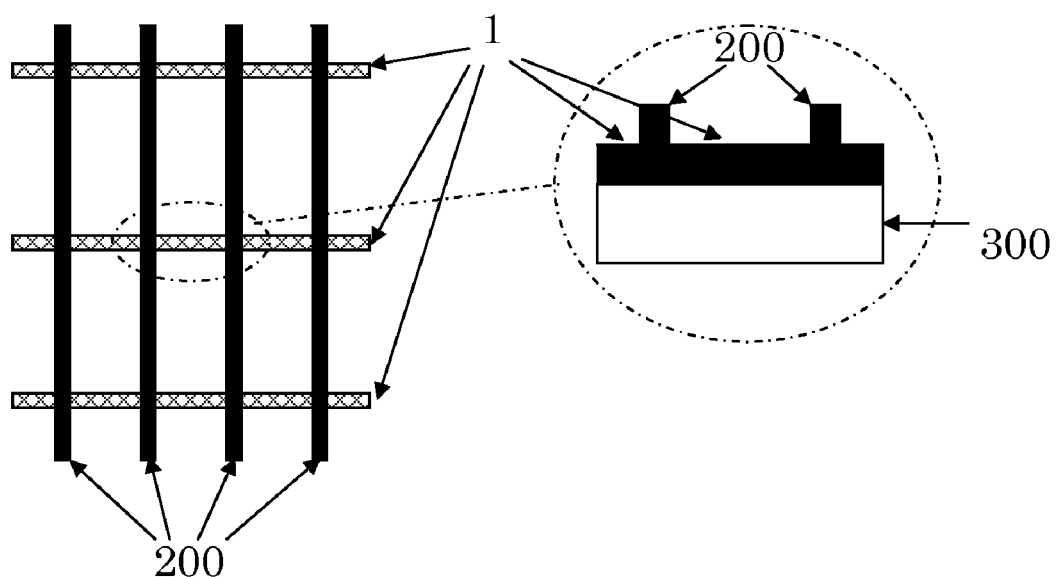
FIG. 1 is an explanatory view showing an example of a process for producing a color filter according to an example of the present invention.

1 . . . substrate, 100 . . . X-direction partition pattern, 2 . . . substrate conveyance stage, 200 . . . Y-direction partition pattern, 3 . . . maintenance station, 300 . . . transparent substrate, 4 . . . inkjet head unit movement axis (first direction), 5 . . . linear scale, 6 . . . inkjet head unit movement base, 7 . . . inverted microscope, 8 . . . conveyance stage control unit, 9 . . . discharge control unit, 10 . . . main controller, 11 . . . substrate conveyance stage conveyance direction (second direction), 12 . . . inkjet head unit movement direction (first direction), 13 . . . inkjet head, 14 . . . inkjet head unit, 15 . . . θ adjustment mechanism (θ axis), 16 . . . lift mechanism (third direction), 17 . . . third direction, 18 . . . θ direction, 19 . . . inkjet head base plate, 20 . . . alignment mark, 41 . . . substrate, 42 . . . inkjet head, 43 . . . colored ink layer, 44 . . . second direction, 45 . . . first direction, 51 . . . substrate, 52 . . . inkjet head, 53 . . . colored ink layer, 54 . . . nozzle

BEST MODE FOR CARRYING OUT THE INVENTION

An embodiment of the present invention is hereinafter described in detail.

FIG. 1 is an explanatory view showing a color filter as one example of a pattern formation substrate according to one embodiment of the present invention. In FIG. 1, 100 is an X-direction partition pattern, 200 is a Y-direction partition pattern and 300 is a transparent substrate.

The pattern formation substrate according to the present invention may be appropriately utilized as an optical part for composing a display screen of the display. In this case, the many areas correspond to pixels for composing the display screen. The partition patterns may also have the function as a black matrix by mixing a light blocking member. In this case, the X-direction partition pattern and the Y-direction partition pattern on the transparent substrate are connected without any disconnection, so that the contrast with a coloring pattern is favorable.

Examples of the optical part include a color filter for composing a display screen of a color liquid crystal display, in which case the coloring pattern composes a colored layer for coloring transmitted light and this colored layer is of plural colors with different tints in each of the areas.

Examples of the optical part include an organic electroluminescent element, in which case the coloring pattern composes an organic luminescent material layer. This is an organic luminescent material layer of plural colors with different tints in each of the areas.

In addition, examples of the pattern formation substrate according to the present invention include a circuit board, a thin-film transistor, a microlens and a biochip.

Examples of the transparent substrate used in the present invention include known transparent materials such as a glass substrate, a quartz substrate, TAC (triacetate cellulose film), PEN (polyethylene naphthalate), PET (polyethylene terephthalate), and other plastics such as acrylic resin. Ordinarily, it is desirable to use a glass substrate excellent in transparency, strength, heat resistance, weather resistance and light resistance. However, the transparent substrate is not limited thereto.

As shown in FIG. 1, in the present invention, the partition patterns are formed on the transparent substrate in an approximately orthogonal grid shape. The partition patterns partition off the surface of the transparent substrate into many openings, and the ink filled in each of these many openings has the function of preventing color mixture of colored inks in the adjacent openings. This is because the coloring pattern of plural colors in an approximately stripe shape is provided in these openings partitioned off with the partition patterns in the later processes.

Examples of a method for forming the partition patterns include various known methods such as a printing method and a photolithographic method. For example, in the case of forming by the photolithographic method, a photosensitive resin composition with photosensitivity provided is used.

This partition pattern is composed of an X-direction partition pattern provided in an approximately orthogonal direction to a longitudinal direction of the stripe of the coloring pattern and a Y-direction partition pattern provided in an approximately parallel direction to a longitudinal direction of the stripe of the coloring pattern. Strictly speaking, an intersection point of the X-direction partition pattern and the Y-direction partition pattern is also included in the partition pattern.

Figure 1B:
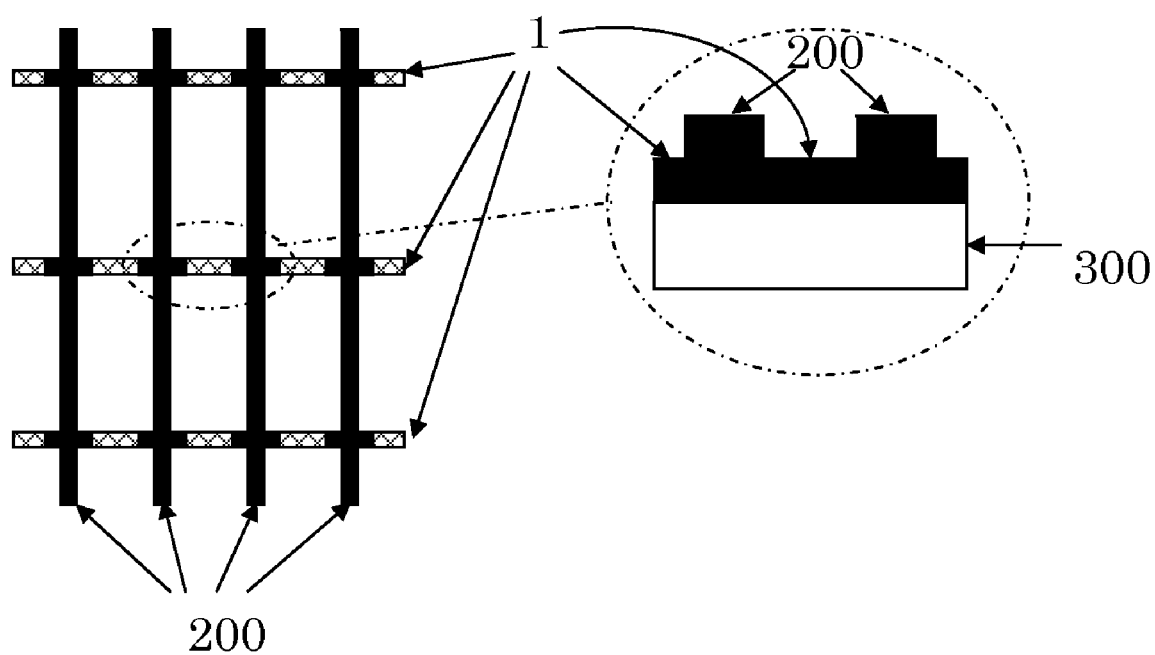
Figure 1C:
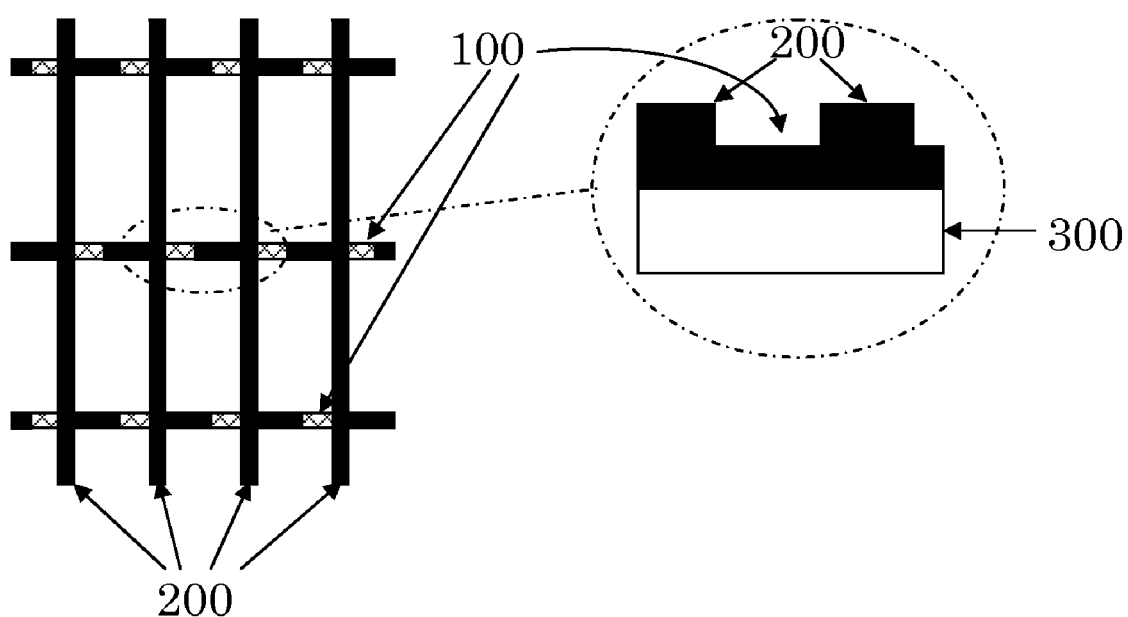

In the present invention, an average film thickness of the X-direction partition pattern is preferably 40% to 90%, more preferably 60% to 80%, of an average film thickness of the Y-direction partition pattern. The height of the partition pattern at the intersection point is not particularly limited and yet needs to be higher than at least the X-direction partition pattern (or a second area of the X-direction partition pattern) for preventing color mixture. The height is preferably the same as the height of the Y-direction partition pattern. In the case of being the same as the height of the Y-direction partition pattern, the intersection point functions effectively as a partition for partitioning off ink (FIG. 1A).

Also, the X-direction partition pattern may be composed of a first area in which an average film thickness is approximately the same as that of the Y-direction partition pattern and a second area in which an average film thickness is 40% to 90% of that of the Y-direction partition pattern. All of the X-direction partition pattern is not determined to be the second area, but the first area in which an average film thickness thereof is approximately the same as that of the Y-direction partition pattern (FIG. 1B) is included. Therefore, by any chance, even in the case where color mixture is caused over the Y-direction partition pattern, there is the effect of decreasing the ratio of ink contaminated by the color mixture further contaminating ink of the same color over the X-direction partition pattern.

Also, the second area of this X-direction partition pattern may be provided in an area close to the selected one Y-direction partition pattern of two Y-direction partition patterns adjacent to the X-direction partition pattern, and may be in a shape such that the selection of the Y-direction partition pattern is alternately performed along the longitudinal direction of the coloring pattern.

For example, a pattern in which the location of the second area alternates in every other pixel (FIG. 1C), and a pattern in which the location alternates in every two pixels, every three pixels and every plural pixels may be determined. The location of the second area may be changed at random.

According to this configuration, the X-direction partition pattern in the second area is alternately provided along the longitudinal direction of the coloring pattern. Therefore, by any chance, even in the case where color mixture is caused over the Y-direction partition pattern and ink contaminated by the color mixture further contaminates adjacent ink of the same color over the X-direction partition pattern, the effect of decreasing the ratio of contaminating further adjacent ink of the same color is obtained.

With regard to the partition pattern in the present invention, an average film thickness of the X-direction partition pattern (or a second area of the X-direction partition pattern) needs to be formed more thinly than an average film thickness of the Y-direction partition pattern orthogonal thereto, and examples of the method include a method in which the partition pattern in a grid shape is formed by various known methods such as a printing method and a photolithographic method to thereafter laminate and form only the Y-direction partition pattern further by various known methods such as a printing method and a photolithographic method. There are also a method in which the X-direction partition pattern of the partition pattern formed by various known methods such as a printing method and a photolithographic method is removed by being irradiating with lasers such as a femtosecond laser and a YAG laser, and a method in which the X-direction partition pattern is physically removed by performing micro abrasion. Examples further include a method for forming partition patterns different in film thickness by using one halftone mask as the mask on the occasion of a photolithographic method. However, the method is not limited thereto.

The line width of the Y-direction partition pattern in the present invention is preferably 5 to 100 µm. In the case where the partition pattern contains a light blocking agent to function as a black matrix, the line width of the Y-direction partition pattern is preferably 5 to 50 µm. The average film thickness thereof is preferably 1.0 to 5.0 µm. Similarly, in the case of functioning as a black matrix, the average film thickness thereof is preferably 1.0 to 4.0 µm. The first area of the X-direction partition pattern has the same film thickness as the Y-direction partition pattern.

The size of an opening formed by the X-direction partition pattern and the Y-direction partition pattern in the present invention is preferably 2,000 to 150,000 µm$^2$.

The line width of the X-direction partition pattern in the present invention is preferably 5 to 200 µm. The average film thickness thereof is preferably 0.4 to 4.5 µm. In the case where the partition pattern contains a light blocking agent to function as a black matrix, the line width thereof is preferably 50 to 150 µm. The average film thickness thereof is preferably 0.4 to 3.6 µm because too low an average film thickness lowers contrast due to white bright spots by optical density and light leakage, while too high an average film thickness makes ink flow on the X-direction partition pattern with such a difficulty as to deteriorate the effect of restraining variations in chromaticity.

In the present invention, in order that ink may move to the adjacent opening on the X-direction partition pattern to obtain the effect of leveling, the diameter of the second area (ink passage width) is preferably 5 to 150 µm when the X-direction partition pattern includes the first area and the second area. In the case where the first area and the second area are not placed in the X-direction partition pattern, the diameter of the X-direction partition pattern for connecting the adjacent openings is preferably 5 to 150 µm.

In the case where the partition pattern is ink-repellent, the diameter of the X-direction partition pattern (or the second area) is preferably 5 to 200 µm. This range allows ink to move to the adjacent opening on the X-direction partition pattern and allows the effect of leveling to be expected. The partition pattern repels ink so that the diameter of the X-direction partition pattern is preferably wider, to the extent that there is no influence on light blockability, than in the case where the partition pattern is not ink-repellent.

Examples of the partition pattern used in the present invention include those composed of a metal-based composition and a resin-based composition. In the case of using a metal-based composition, a composition in which a pattern may be formed by an evaporation method, a sputtering method and an ion plating method, such as Cr and Mn, is used.

In the case of providing the partition pattern by using a resin-based composition, the partition pattern may be formed by a photolithographic method after applying the composition on the whole plane by a spin coat method, a die coat method, a roll coat method or a curtain coat method, or by a method for performing the patterning from the beginning, such as screen printing, relief printing, gravure printing, planographic printing, inkjet printing and transfer method.

The following is the description based on a photolithographic method for convenience, but the present invention is not limited to such a method.

In the case of providing the partition pattern by a photolithographic method, positive resist and negative resist may be used. These positive resist and negative resist may contain binder resin, solvent, monomer and light blocking agent. In the case of the negative resist, a photopolymerization initiator may be further contained. Other additives may be added as required.

The binder resin is preferably resin containing an amino group, an amide group, a carboxyl group and a hydroxyl group. Specific examples thereof include cresol-novolac resin, polyvinyl phenolic resin, acrylic resin, methacrylic resin and melamine resin. These resin compositions may be used alone or by mixture of two kinds or more.

Specific examples of the solvent include dichloromethane, dichloroethane, chloroform, acetone, cyclohexanone, ethyl acetate, 2-methoxyethanol, 2-ethoxyethanol, 2-butoxyethanol, 2-ethylethoxy acetate, 2-butoxyethyl acetate, 2-methoxyethyl ether, 2-ethoxyethyl ether, 2-(2-ethoxyethoxy)ethanol, 2-(2-butoxyethoxy)ethanol, 2-(2'-ethoxyethoxy)ethyl acetate, 2-(2-butoxyethoxy)ethyl acetate, propylene glycol monomethyl ether, propylene glycol monomethyl ether acetate, diethylene glycol dimethyl ether, and tetrahydrofuran. It is desirable that the used amount of the solvent be adjusted so as to allow homogeneity when printed or applied on the substrate and an applied film with no pinholes or uneven coating. The content of such solvent is preferably adjusted so that the solvent amount becomes 50 to 97% by weight with respect to the total weight of the resin composition.

Examples of the monomer include a monomer having a vinyl group or an allyl group, an oligomer, and a molecule having a vinyl group or an allyl group at the end or side chain. Specific examples thereof include (meth)acrylic acid and salts thereof, (meth)acrylates, (meth)acrylamides, maleic anhydride, maleate, itaconate, styrenes, vinyl ethers, vinyl esters, N-vinyl heterocyclics, allyl ethers, allyl esters, and derivatives thereof. Examples of an appropriate compound include comparatively low-molecular-weight polyfunctional acrylates such as pentaerythritol triacrylate, trimethylolpropane triacrylate, pentaerythritol tetraacrylate, ditrimethylolpropane tetraacrylate, and dipentaerythritol penta and hexaacrylate. These monomers may be used alone or by mixture of two kinds or more. The amount of the monomer may be in the range of 1 to 200 parts by weight, preferably 50 to 150 parts by weight, with respect to 100 parts by weight of the binder resin.

Examples of the photopolymerization initiator include benzophenone compounds such as benzophenone, 4,4'-bis(dimethylamino)benzophenone and 4,4'-bis(diethylamino)benzophenone. Also, examples of the photopolymerization initiator include acetophenone derivatives such as 1-hydroxycyclohexyl acetophenone, 2,2-dimethoxy-2-phenyl acetophenone and 2-methyl-1-[4-(methylthio)phenyl]-2-morpholinopropane-1-one. Also, examples thereof include thioxanthone derivatives such as thioxanthone, 2,4-diethyl thioxanthone, 2-isopropyl thioxanthone and 2-chloro thioxanthone. Also, examples thereof include anthraquinone derivatives such as 2-methyl anthraquinone, 2-ethyl anthraquinone, 2-tert-butyl anthraquinone and chloro anthraquinone. Also, examples thereof include benzoin ether derivatives such as benzoin methyl ether, benzoin ethyl ether and benzoin phenyl ether. Also, examples thereof include an acyl phosphine derivative such as phenylbis-(2,4,6-trimethylbenzoyl)-phosphine oxide, lophinemer such as 2-(orthochlorophenyl)-4,5-bis(4'-methylphenyl)imidazolyl dimer, N-arylglycines such as N-phenylglycine, organic azides such as 4,4'-diazide chalcone, 3,3',4,4'-tetra(tert-butylperoxycarboxy)benzophenone, and a chinone diazide group-containing compound. These photopolymerization initiators may be used alone or by mixture of two kinds or more. The amount of the photopolymerization initiator may be in the range of 0.1 to 50 parts by weight, preferably 1 to 20 parts by weight, with respect to 100 parts by weight of the binder resin.

Examples of the additives include a leveling agent, a chain transfer agent, a stabilizer, a sensitizing dye, a surfactant and a coupling agent.

The partition pattern may contain a light blocking agent. The partition pattern may be used as a black matrix substrate by reason of having a light blocking agent. Examples of the light blocking agent include known materials. Specific examples thereof include carbon black and aniline black, graphite, iron black, titanium oxide, black pigment, black dye, inorganic pigment, and organic pigment. These light blocking agents may be used alone or by mixture of two kinds or more.

The partition pattern may have ink repellency. Examples of a method for allowing ink repellency include the mixing of an ink-repellent material into the resin composition and the ink-repellent treatment after forming the pattern.

Examples of the ink-repellent material include a compound having a region with water repellency and compatibility with the resin binder of the partition pattern. The region with water repellency is preferably a fluoroalkyl group, more preferably a perfluoroalkyl group. Examples of the region exhibiting the compatibility with the resin binder include known lipophilic polymers such as an alkyl group, an alkylene group and polyvinyl alcohol. Additionally, a material containing an atom such as fluorine or silicon may be used. Examples thereof include fluorinated resin such as vinylidene fluoride, vinyl fluoride, ethylene trifluoride and copolymers thereof. In particular, a fluorine-containing copolymer with a mass-average molecular weight of 10,000 to 100,000 is preferable, specifically including fluorine-containing copolymers. The silicon compound contains organic silicon in a main chain or a side chain, examples thereof including silicon resin and silicone rubber containing a siloxane component. These silicon-containing compounds may be used alone or by mixture of two kinds or more. In addition, the fluorine-containing compound and silicon-containing compound or another ink-repellent component may be used together. These ink-repellent materials may be used alone or by mixture of two kinds or more. For example, in the case where the ink-repellent material is mixed into the resin composition to form the partition pattern, a resin composition in which the ink-repellent material is mixed in an amount of 0.1% by weight to 10% by weight with respect to the total parts by weight may be used.

The ink-repellent treatment may be performed by performing plasma or corona treatment with the use of gas capable of exhibiting ink repellency, such as fluorine-containing gas.

With regard to ink repellency on the partition pattern surface in the present invention, the partition pattern is preferably formed so that the result of performing anion analysis on the surface of the partition pattern after forming the partition pattern by a time-of-flight secondary ion mass spectrometer (TOF-SIMS) shows that the detection strength of fluorine ions becomes 0.3 to 0.6 when the total of the detection strength of all anions is regarded as 1 (normalized). In particular, it is desirable that the detection strength of the Y-direction partition pattern become 0.3 to 0.6 and the detection strength of the X-direction partition pattern (when including the first area and the second area, only the second area of the X-direction partition pattern) become 0.1 or less. Examples of a method for forming such a partition pattern include the method by using laser, and a method for performing photolithography of the partition pattern by using an ink-repellent material having surface activity to then form the partition patterns different in film thickness with one halftone mask as the mask.

The coloring pattern of the present invention may be composed of a composition containing resin binder and coloring matter made of coloring pigment or dye. The coloring pigment varies with each color; examples of red coloring pigment include C. I. Pigment Violet 19, C. I. Pigment Violet 23, C. I. Pigment Violet 29, C. I. Pigment Violet 30, C. I. Pigment Violet 37, C. I. Pigment Violet 40, C. I. Pigment Violet 50, C. I. Pigment Red 7, C. I. Pigment Red 9, C. I. Pigment Red 14, C. I. Pigment Red 41, C. I. Pigment Red 48:1, C. I. Pigment Red 48:2, C. I. Pigment Red 48:3, C. I. Pigment Red 48:4, C. I. Pigment Red 97, C. I. Pigment Red 122, C. I. Pigment Red 123, C. I. Pigment Red 146, C. I. Pigment Red 149, C. I. Pigment Red 177, C. I. Pigment Red 178, C. I. Pigment Red 180, C. I. Pigment Red 184, C. I. Pigment Red 185, C. I. Pigment Red 187, C. I. Pigment Red 192, C. I. Pigment Red 200, C. I. Pigment Red 202, C. I. Pigment Red 208, C. I. Pigment Red 210, C. I. Pigment Red 216, C. I. Pigment Red 220, C. I. Pigment Red 221, C. I. Pigment Red 223, C. I. Pigment Red 226, C. I. Pigment Red 227, C. I. Pigment Red 240, C. I. Pigment Red 246, C. I. Pigment Red 255, C. I. Pigment Red 264, and C. I. Pigment Red 272. In addition, a mixture of C. I. Pigment Red 254 and C. I. Pigment Red 177 may be used.

Examples of green coloring pigment include C. I. Pigment Green 7 and C. I. Pigment Green 36. In addition, a mixture of C. I. Pigment Green 36 and C. I. Pigment Yellow 150, C. I. Pigment Yellow 139 or C. I. Pigment Yellow 13 may be used.

Examples of blue coloring pigment include C. I. Pigment Blue 15, C. I. Pigment Blue 15:3, C. I. Pigment Blue 15:4, C. I. Pigment Blue 15:6, C. I. Pigment Blue 22 and C. I. Pigment Blue 60. These pigments may be used by mixture of two kinds or more.

Examples of the resin binder include polyimide resin, acrylic resin, epoxy resin and melamine resin, which are properly selected in relation with coloring matter. In addition, these may be used by mixture of two kinds or more.

In the case of forming an organic EL element as the pattern formation substrate, ink containing an organic luminescent material is discharged from an inkjet printer. This ink may contain an organic luminescent material, solvent and resin binder as required. The same materials as those described in forming the partition pattern may be used for solvent and resin binder.

Examples of the organic luminescent material include organic luminescent materials soluble in organic solvent, such as coumarin-based, perylene-based, pyran-based, anthrone-based, porphyrin-based, quinacridon-based, N,N'-dialkyl-substituted quinacridon-based, naphthalimide-based, N,N'-diaryl-substituted pyrrolopyrrole-based and iridium complex-based materials, dispersions of the organic luminescent materials into polymers such as polystyrene, polymethyl methacrylate and polyvinyl carbazole, and polymeric organic luminescent materials such as polyarylene-based, polyarylene vinylene-based and polyfluorene-based materials.

Various application methods may be used for forming the coloring pattern in the present invention. For example, the coloring pattern may be formed by a photolithographic method after applying the composition on the whole plane by a spin coat method, a die coat method, a roll coat method and a curtain coat method, and a method for performing the patterning from the beginning, such as screen printing, relief printing, gravure printing, planographic printing, inkjet method and transfer method.

A method adopting the latter "a forming system by a method for performing the patterning from the beginning" is applied to the present invention to bring a particularly favorable effect. The case of an inkjet method is hereinafter described as an example but the present invention is not limited to such a system.

The case where colored ink containing coloring pigment is applied by inkjet to produce a color filter is hereinafter described as an example.

The ink is provided on a transparent substrate and a pattern formation substrate including a partition pattern thereon by an inkjet printer to form a color filter. A method for producing a color filter provided with colored ink layers of RGB is hereinafter described. An organic luminous layer may be also formed instead of the colored ink layers.

As described above, for producing a color filter by an inkjet printer, a method (a first method) for discharging ink while the main scanning direction is parallel to the direction of ink provided in a stripe shape is known. Also, a method (a second method) for discharging ink while the main scanning direction is perpendicular to the direction of ink provided in a stripe shape is known. The present invention may use either method. The outline of a method for producing a color filter by using the second method is shown in FIG. 5.

An inkjet head 42 for discharging colored ink of each of RGB three colors is disposed (three in total). The inkjet head 42 is disposed so that the nozzle becomes approximately perpendicular to the main scanning direction (a second direction 44).

Figure 5A:
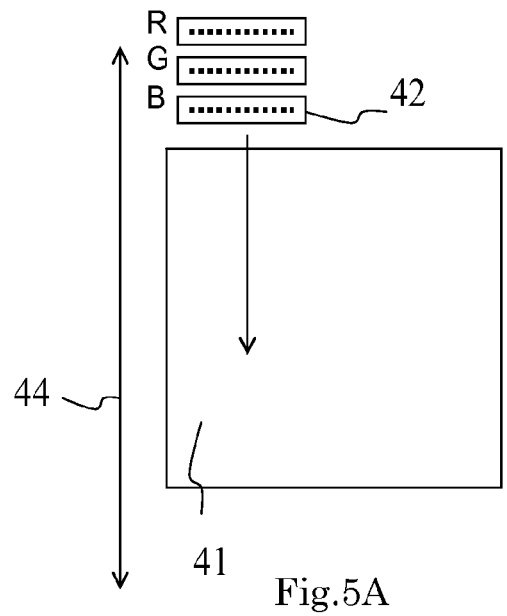
FIG. 5 is a schematic view of a method for operating an inkjet printer according to a second method.
Figure 5B:
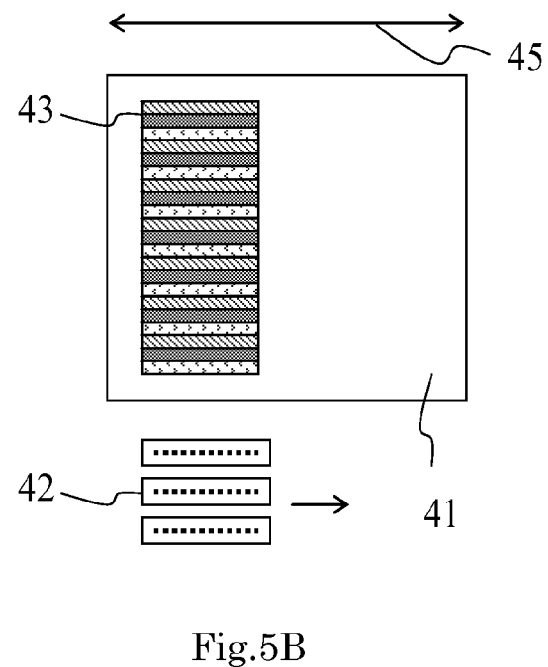

These three inkjet heads compose a single inkjet head unit integrally and inseparably. This inkjet head unit 42 is scanned on a substrate 41 in parallel with the second direction 44 to form colored ink layers 43 of RGB three colors (FIG. 5A). Each of the colored ink layers 43 of three colors is formed in a stripe shape so as to become parallel with the first direction. The colored ink layers 43 may be formed in a grid shape in parallel with the first direction 45. The previous provision of the partition on the substrate 41 as required effectively prevents color mixture of colored ink. Also, an image receiving layer made of transparent resin may be previously provided on the substrate 41. Subsequently, the inkjet head unit 42 may be subject to the sub-scanning along the first direction and thereafter further subject to the main scanning in the reverse direction (FIG. 5B).

Figure 6:
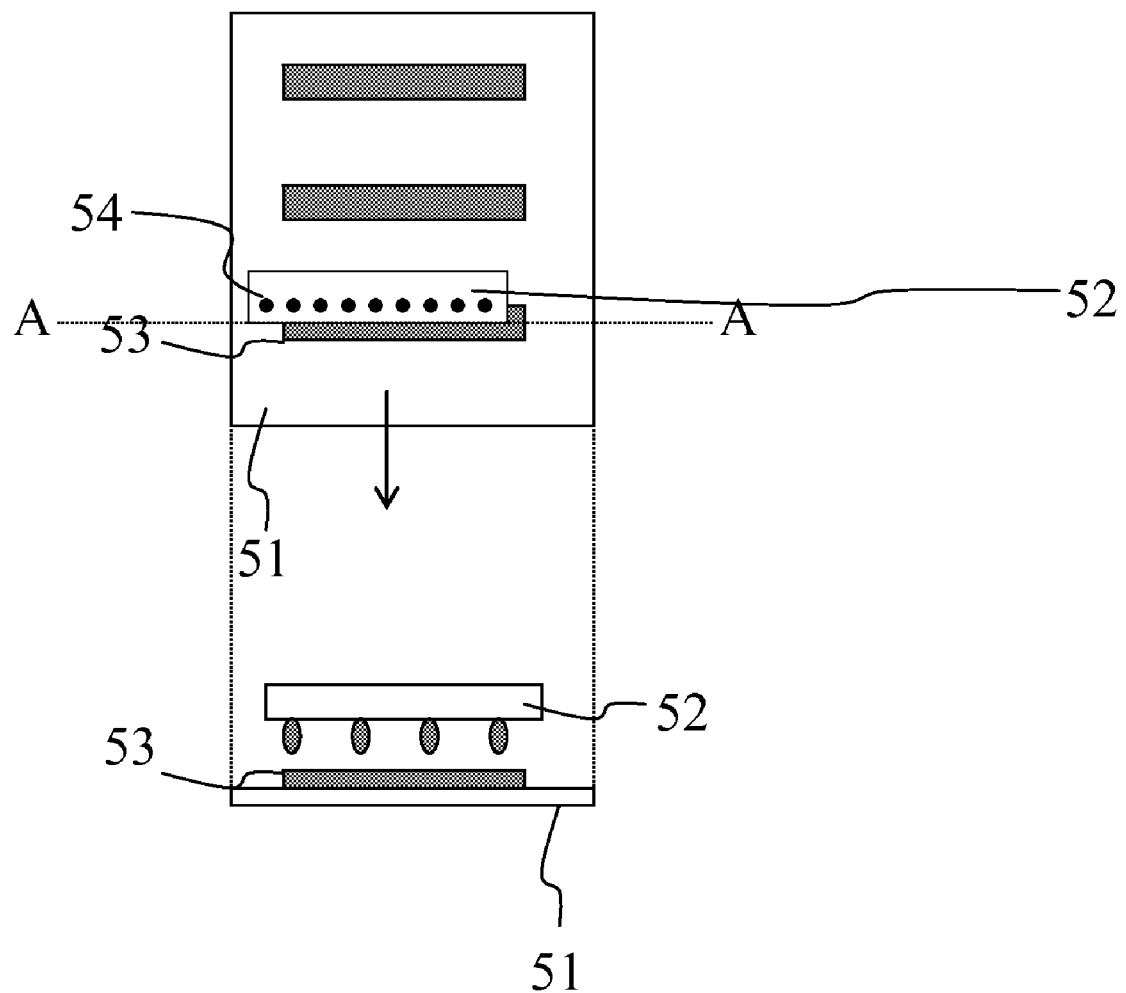
FIG. 6 is a schematic view of the method for operating the inkjet printer according to the second method.

FIG. 6 shows the movement of an inkjet head in the case of noticing the movement of an inkjet head of one color. An inkjet head 52 is scanned on a substrate 51 along the second direction (the direction of the arrow in the FIG. 6), and ink is discharged from a nozzle 54 at regular time intervals to form a colored ink layer 53 in a stripe shape at regular distance intervals.

An inkjet printer used for forming the coloring pattern may be mainly selected from a piezo conversion system and a thermal conversion system, depending on an ink discharging method. In particular, the piezo conversion system is appropriate on the occasion of applying a color filter as the pattern formation substrate.

Preferable is a device in which the atomization frequency of ink is approximately 5 to 100 KHz, the nozzle diameter is approximately 5 to 80 µm, three heads are disposed, and 60 to 500 nozzles are incorporated into one head. The ink is discharged into an opening partitioned off with the partition pattern by an inkjet system to thereafter vaporize solvent, and subsequently resin in the ink is cured by UV irradiation and heat to form the coloring pattern. An example is hereinafter described in detail.

Figure 2:
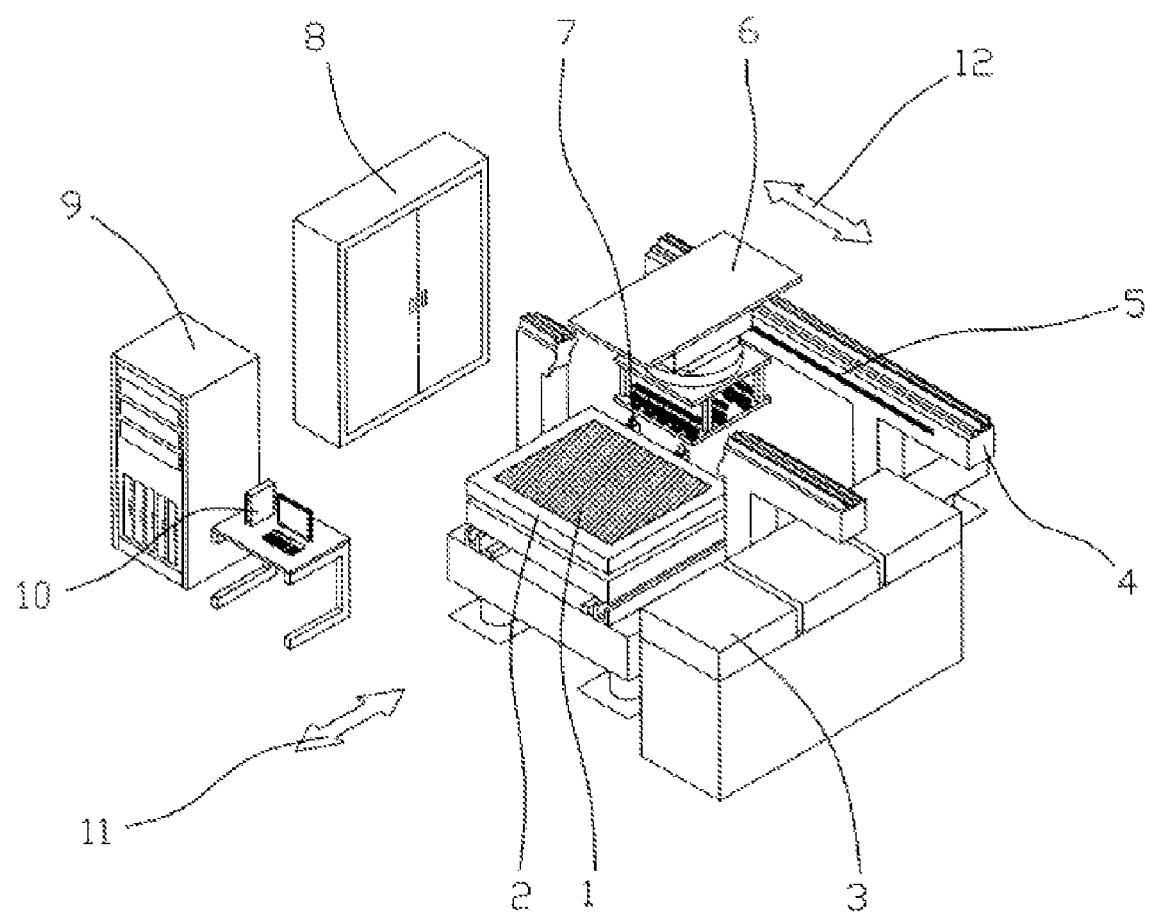
FIG. 2 is a general view of an inkjet printer according to an embodiment of the present invention.
Figure 3:
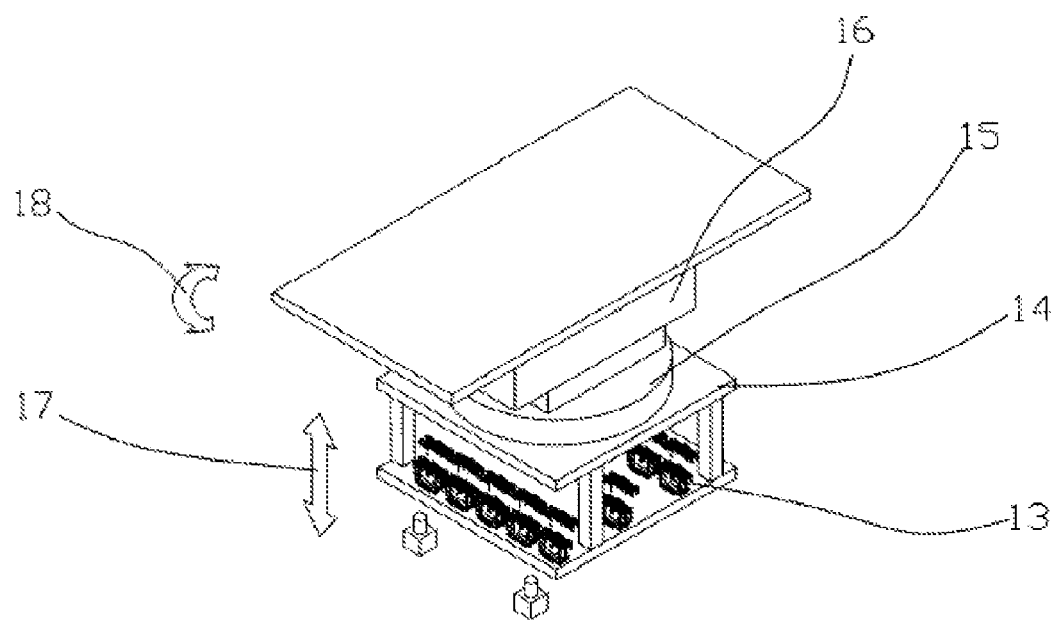
FIG. 3 is a configuration view of an inkjet head unit.

FIG. 2 shows a general view of an example of an inkjet printer and peripheral equipment that can be used for the embodiment of the present invention. An inkjet printer is composed of a substrate conveyance stage 2 having a substrate 1 mounted thereon, an inkjet head unit 14, an inkjet head unit movement axis 4, a main controller 10 and a discharge control unit 9. The inkjet head unit has single or plural inkjet heads mounted thereon. FIG. 3 shows an example of the inkjet head unit 14 having plural inkjet heads 13 mounted thereon. The inkjet head is provided with many nozzles (not shown in FIG. 3) approximately arrayed in a specific direction.

A substrate to be applied is mounted on the substrate conveyance stage 2. Examples of the substrate include optical elements such as a color filter and an organic electroluminescent element, and elements with precise patterns, such as a wiring circuit board and a biochip. The substrate conveyance stage 2 moves along a predetermined substrate conveyance stage conveyance direction 11. The substrate conveyance stage conveyance direction 11 is parallel to the main scanning direction.

The inkjet head unit 14 moves along the main scanning direction on the inkjet head unit movement axis 4. The inkjet head unit movement axis 4 is perpendicular to the scanning direction 11 of the inkjet head unit. The inkjet head unit is subject to the sub-scanning along this inkjet head unit movement axis.

Hereinafter, the direction in which the inkjet head unit is subject to the sub-scanning is regarded as the first direction, and the direction in which the inkjet head unit is subject to the main scanning is regarded as the second direction.

The substrate conveyance stage 2 is provided with a vacuum adsorption hole for fixing the substrate 1, and may fix the substrate without any projections from the substrate surface. Thus, a gap between the substrate 1 and the inkjet head 13 can be approached to the minimum.

The discharge control unit 9 incorporates a memory unit (not shown) for storing a measured value of linearity in tracks of the inkjet head unit movement.

Thus, linearity in an arbitrary location on the first direction axis of the inkjet head unit may be grasped, and even though the inkjet head unit 14 is not a line with respect to the first direction axis in a desired location, application accuracy may be corrected by changing discharge timing of the nozzle correspondingly to linearity (shift) in the location.

FIG. 3 shows the detail of the inkjet head unit 14 and a peripheral mechanism thereof.

The inkjet head unit 14 is provided with plural inkjet heads. The inkjet head is provided with plural nozzles for discharging ink. These nozzles are disposed at predetermined regular intervals along the first direction.

The shift of the alignment of the inkjet head from a predetermined direction is called rotation shift of the inkjet head. Thus, an inkjet application device is provided with a θ adjustment mechanism 15 for correcting the shift in the rotation direction (also referred to as θ direction hereinafter). The θ adjustment mechanism 15 can adjust the approximate direction of plural inkjet heads as a whole on the occasion of mounting the plural inkjet heads on the inkjet head unit.

FIG. 2 shows two detecting means (an inverted microscope 7) for detecting this rotation shift of the inkjet head. The inkjet head is occasionally inclined to cause shift in the upward and downward direction (a third direction). A gap adjustment mechanism (not shown) is effectively provided for correcting this shift in the third direction.

Figure 4:
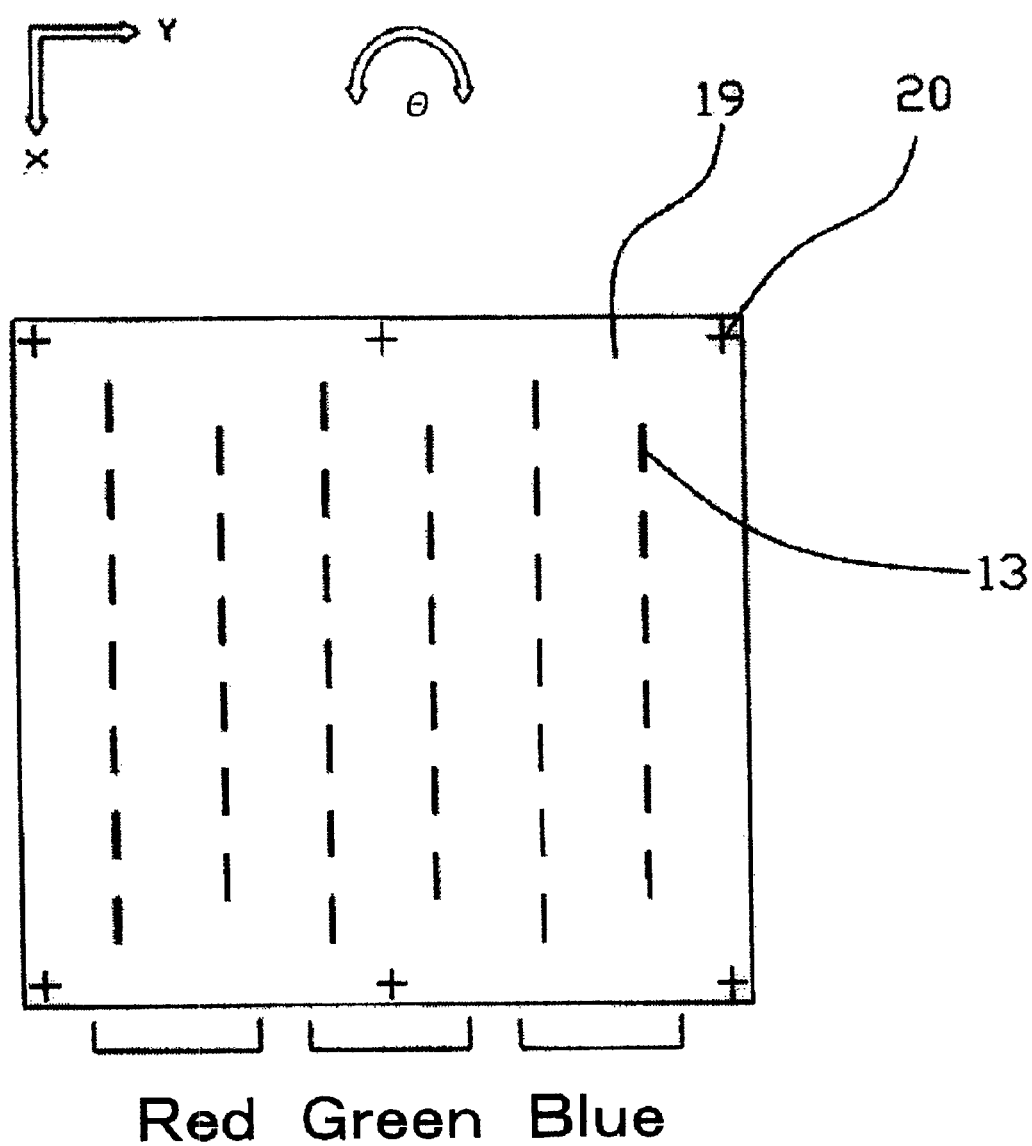
FIG. 4 is a plan view showing a disposition example of an inkjet head.

FIG. 4 is a plan view showing a disposition example of each of the inkjet heads in the inkjet head unit provided with plural inkjet heads.

The inkjet heads 13 are disposed in parallel along the first direction of an inkjet head base plate 19. The width of the inkjet head itself is wider than the nozzle range so that the adjacent inkjet heads are disposed in a zigzag shape shifted along the second direction. Thus, the ink discharge may be rendered linear with favorable precision by changing discharge timing of the nozzle belonging to the inkjet head in accordance with a distance in the second direction between the inkjet head and the adjacent inkjet head.

EXAMPLE 1

Example 1 of the present invention is specifically described hereinafter.

<Production of Partition Pattern>

Alkali-free glass was used as a transparent substrate. A photosensitive resin composition (formed by acrylic resin, cyclohexanone, carbon pigment, dispersant, compound having radical polymerizability, that is, trimethylolpropane triacrylate, and photopolymerization initiator) was applied on the transparent substrate by a spin coat method so as to have a thickness of 1.0 μm, the solvent was dried by a hot plate, exposed through a photomask produced so as to form a partition pattern in a grid shape, developed by alkali aqueous solution, and heated and fired by an oven to obtain a black matrix partition pattern in a grid shape. Next, a photosensitive resin composition containing an ink-repellent material (formed by acrylic resin, cyclohexanone, carbon pigment, dispersant, compound having radical polymerizability, that is, trimethylolpropane triacrylate, photopolymerization initiator, and fluorine-containing compound) was further applied on this transparent substrate by a spin coat method so as to have a thickness of 1.0 μm, the solvent was dried by a hot plate, alignment-exposed with the partition pattern in a grid shape so as to laminate a Y-direction partition pattern through a photomask produced so as to form only a Y-direction partition pattern, developed by alkali aqueous solution, and heated and fired by an oven to form a partition pattern shown in FIG. 1A on the transparent substrate. It was confirmed that the average film thickness of the X-direction partition pattern 100 was 50% of the average film thickness of the Y-direction partition pattern 200 perpendicular thereto, the optical density of the X-direction partition pattern 100 was 3 or more, and the partition pattern with less contrast decrease due to white bright spots and light leakage was obtained. In anion analysis by a time-of-flight secondary ion mass spectrometer (TOF-SIMS) on the surface of the Y-direction partition pattern 200, it was confirmed that the detection strength of fluorine ions was approximately 0.5 when the total of the detection strength of all anions was regarded as 1 (normalized), the fluorine-containing compound as the ink-repellent material existed on the partition pattern surface in large amount, and the partition pattern capable of preventing color mixture of the coloring patterns in the adjacent openings, which were intended for no color mixture in filling ink, was obtained.

<Formation of Coloring Pattern>

Colored inks of red, blue and green (adjusted so that the ratio of the inks except solvent in the total mass of all solid contents was 50% by mass to exhibit necessary spectral characteristics, and adjusted so that all solid content concentration of the solvent in the inks was 30% by mass) were each discharged into an opening partitioned off with the partition pattern on this substrate by using an inkjet system, and thereafter heated and cured to obtain a color filter. When the film thickness of each pixel with the coloring pattern formed was measured in this color filter, the maximum value of film thickness difference between the adjacent pixels of the same color was 50 nm or less, and when color difference ΔE*ab (color difference in using L*a*b* color system) between the adjacent pixels of the same color was measured, the maximum value thereof was 0.5 or less, so that it was confirmed that the color filter with less color shading was obtained.

EXAMPLE 2

Example 2 of the present invention is specifically described hereinafter.

<Production of Partition Pattern>

Alkali-free glass was used as a transparent substrate. A photosensitive resin composition containing an ink-repellent material (formed by acrylic resin, cyclohexanone, carbon pigment, dispersant, compound having radical polymerizability, that is, trimethylolpropane triacrylate, photopolymerization initiator, and fluorine-containing compound) was applied on the transparent substrate by a spin coat method so as to have a thickness of 2.0 μm, the solvent was dried by a hot plate, exposed through a photomask produced so as to form a partition pattern in a grid shape, developed by alkali aqueous solution, and heated and fired by an oven to obtain a black matrix partition pattern in a grid shape. Next, the X-direction partition pattern portion of this substrate was irradiated with a femtosecond laser and removed so that the average film thickness became 1.5 μm to form a partition pattern shown in FIG. 1B on the transparent substrate. It was confirmed that the average film thickness of the X-direction partition pattern 100 was 75% of the average film thickness of the Y-direction partition pattern 200 perpendicular thereto, the optical density of the X-direction partition pattern 100 was 4 or more, the diameter of the X-direction partition pattern connecting the adjacent openings was 50 μm, and the partition pattern with far less contrast decrease due to white bright spots and light leakage was obtained. In anion analysis by a time-of-flight secondary ion mass spectrometer (TOF-SIMS) on the surface of the Y-direction partition pattern 200, it was confirmed that the detection strength of fluorine ions was approximately 0.5 when the total of the detection strength of all anions was regarded as 1 (normalized), the fluorine-containing compound as the ink-repellent material existed on the partition pattern surface in large amount, and the partition pattern capable of preventing color mixture of the coloring patterns in the adjacent openings, which were intended for no color mixture in filling ink, was obtained.

<Formation of Coloring Pattern>

Colored inks of red, blue and green (adjusted so that the ratio of the inks except solvent in the total mass of all solid contents was 50% by mass to exhibit necessary spectral characteristics, and adjusted so that all solid content concentration of the solvent in the inks was 30% by mass) were each discharged into an opening partitioned off with the partition pattern on this substrate by using an inkjet system, and thereafter heated and cured to obtain a color filter. When the film thickness of each pixel with the coloring pattern formed was measured in this color filter, the maximum value of film thickness difference between the adjacent pixels of the same color was 50 nm or less, and when color difference ΔE*ab (color difference in using L*a*b* color system) between the adjacent pixels of the same color was measured, the maximum value thereof was 0.5 or less, so that it was confirmed that the color filter with less color shading was obtained.

EXAMPLE 3

Example 3 of the present invention is specifically described hereinafter.
<Production of Partition Pattern>
Alkali-free glass was used as a transparent substrate. A photosensitive resin composition (formed by acrylic resin, cyclohexanone, carbon pigment, dispersant, compound having radical polymerizability, that is, trimethylolpropane triacrylate, and photopolymerization initiator) was applied on the transparent substrate by a spin coat method so as to have a thickness of 1.0 μm, the solvent was dried by a hot plate, exposed through a photomask produced so as to form a partition pattern in a grid shape, developed by alkali aqueous solution, and heated and fired by an oven to obtain a black matrix partition pattern in a grid shape. Next, a photosensitive resin composition containing an ink-repellent material (formed by acrylic resin, cyclohexanone, carbon pigment, dispersant, compound having radical polymerizability, that is, trimethylolpropane triacrylate, photopolymerization initiator, and fluorine-containing compound) was further applied on this transparent substrate by a spin coat method so as to have a thickness of 1.0 μm, the solvent was dried by a hot plate, alignment-exposed with the partition pattern in a grid shape so as to laminate a partition pattern through a photomask produced so as to form a Y-direction partition pattern and part of an X-direction partition pattern, developed by alkali aqueous solution, and heated and fired by an oven to form a partition pattern shown in FIG. 1C on the transparent substrate. It was confirmed that the average film thickness of the X-direction partition pattern 100 was 50% of the average film thickness of the Y-direction partition pattern 200, the optical density of the X-direction partition pattern 100 was 3 or more, the diameter of the X-direction partition pattern connecting the adjacent openings was 50 μm, and the partition pattern with far less contrast decrease due to white bright spots and light leakage was obtained. In anion analysis by a time-of-flight secondary ion mass spectrometer (TOF-SIMS) on the surface of the Y-direction partition pattern 200, it was confirmed that the detection strength of fluorine ions was approximately 0.5 when the total of the detection strength of all anions was regarded as 1 (normalized), the fluorine-containing compound as the ink-repellent material existed on the partition pattern surface in large amount, and the partition pattern capable of preventing color mixture of the coloring patterns in the adjacent openings, which were intended for no color mixture in filling ink, was obtained.
<Formation of Coloring Pattern>
Colored inks of red, blue and green (adjusted so that the ratio of the inks except solvent in the total mass of all solid contents was 50% by mass to exhibit necessary spectral characteristics, and adjusted so that all solid content concentration of the solvent in the inks was 30% by mass) were each discharged into an opening partitioned off with the partition pattern on this substrate by using an inkjet system, and thereafter heated and cured to obtain a color filter. When the film thickness of each pixel with the coloring pattern formed was measured in this color filter, the maximum value of film thickness difference between the adjacent pixels of the same color was 50 nm or less, and when color difference ΔE*ab (color difference in using L*a*b* color system) between the adjacent pixels of the same color was measured, the maximum value thereof was 0.5 or less, so that it was confirmed that the color filter with less color shading was obtained. In addition, in the produced color filter, when color mixture of the coloring patterns in the adjacent openings, which were intended for no color mixture in filling colored ink, was forcibly caused to observe the portion, the area of the portion with color mixture became smaller than one opening area and the X-direction partition pattern 2 with thin film thickness was not parallel but alternate with the Y-direction partition pattern 200, so that it was confirmed that the flowability of the colored ink was deteriorated and the pixel defective area was reduced.

COMPARATIVE EXAMPLE 1

Comparative Example 1 of the present invention is specifically described hereinafter.
<Production of Partition Pattern>
Alkali-free glass was used as a transparent substrate. A photosensitive resin composition containing an ink-repellent material (formed by acrylic resin, cyclohexanone, carbon pigment, dispersant, compound having radical polymerizability, that is, trimethylolpropane triacrylate, photopolymerization initiator, and fluorine-containing compound) was applied on the transparent substrate by a spin coat method so as to have a thickness of 2.0 μm, the solvent was dried by a hot plate, exposed through a photomask produced so as to form a partition pattern in a grid shape, developed by alkali aqueous solution, and heated and fired by an oven to form a black matrix partition pattern in a grid shape. It was confirmed that the partition pattern, in which the average film thickness of the X-direction partition pattern 100 is equal to the average film thickness of the Y-direction partition pattern 200, was obtained.
<Formation of Coloring Pattern>
Colored inks of red, blue and green (adjusted so that the ratio of the inks except solvent in the total mass of all solid contents was 50% by mass to exhibit necessary spectral characteristics, and adjusted so that all solid content concentration of the solvent in the inks was 30% by mass) were each discharged into an opening partitioned off with the partition pattern on this substrate by using an inkjet system, and thereafter heated and cured to obtain a color filter. When the film thickness of each pixel with the coloring pattern formed was measured in this color filter, the maximum value of film thickness difference between the adjacent pixels of the same color was 50 nm or more, and when color difference ΔE*ab (color difference in using L*a*b* color system) between the adjacent pixels of the same color was measured, the maximum value thereof was 1.0, so that the color filter with color shading was obtained.

COMPARATIVE EXAMPLE 2

Comparative Example 2 of the present invention is specifically described hereinafter.
<Production of Partition>
Alkali-free glass was used as a transparent substrate. A photosensitive resin composition containing an ink-repellent material (formed by acrylic resin, cyclohexanone, carbon pigment, dispersant, compound having radical polymerizability, that is, trimethylolpropane triacrylate, photopolymerization initiator, and fluorine-containing compound) was applied on the transparent substrate by a spin coat method so as to have a thickness of 2.0 μm, the solvent was dried by a hot plate, exposed through a photomask produced so as to form a partition pattern in a stripe shape with no X-direction partition patterns, developed by alkali aqueous solution, and heated and fired by an oven to form a black matrix partition pattern in a stripe shape.

<Formation of Coloring Pattern>

Colored inks of red, blue and green (adjusted so that the ratio of the inks except solvent in the total mass of all solid contents was 50% by mass to exhibit necessary spectral characteristics, and adjusted so that all solid content concentration of the solvent in the inks was 30% by mass) was discharged into an opening partitioned off in a stripe shape on this substrate by using an inkjet system, and thereafter heated and cured to obtain a color filter. When the film thickness of each pixel with the coloring pattern formed was measured in this color filter, the maximum value of film thickness difference between the adjacent pixels of the same color was 50 nm or less, and when color difference ΔE*ab (color difference in using L*a*b* color system) between the adjacent pixels of the same color was measured, the maximum value thereof was 0.5 or less, so that the color filter with no color shading was obtained. However, it was found that the color filter with light leakage, white bright spots and low contrast was obtained when made into a liquid crystal display device by reason of having no X-direction partition patterns. Also, in the produced color filter, when color mixture of the coloring patterns in the adjacent openings, which were intended for no color mixture in filling colored ink, was forcibly caused to observe the portion, the area of the portion with color mixture became a larger area than one opening area, so that it was confirmed that the substrate with large-area color mixture defect was obtained.

INDUSTRIAL APPLICABILITY

The pattern formation substrate according to the present invention may be appropriately utilized as an optical part for composing a display screen of the display. Examples of the optical part include a color filter for composing a display screen of a color liquid crystal display, and an organic electroluminescent element.

In addition, examples thereof include a circuit board, a thin-film transistor, a microlens and a biochip.

The invention claimed is:

1. A color filter comprising a pattern formation substrate, the pattern formation substrate comprising:
    a transparent substrate;
    a partition pattern formed on the transparent substrate in an approximately orthogonal grid shape; and
    a coloring pattern of plural colors, provided in an opening partitioned off with the partition pattern,
    wherein the coloring pattern is formed in an approximately stripe shape in each one of the plural colors,
    the partition pattern is composed of an X-direction partition pattern provided in an approximately orthogonal direction to a longitudinal direction of the stripe of the coloring pattern and a Y-direction partition pattern provided in an approximately parallel direction to the longitudinal direction of the stripe of the coloring pattern,
    the X-direction partition pattern is composed of a first area in which an average film thickness is approximately the same as that of the Y-direction partition pattern and a second area in which an average film thickness is smaller than that of the Y-direction partition pattern,
    the second area is provided in an area close to a selected one of two Y-direction partition patterns adjacent to the X-direction partition pattern, and
    the selected one of the two Y-direction partition patterns alternates along the longitudinal direction of the stripe of the coloring pattern.

2. The color filter according to claim 1, wherein the average film thickness of the second area of the X-direction partition pattern is 40% to 90% of that of the Y-direction partition pattern.

3. The color filter according to claim 1, wherein a ratio of a length of the first area in the whole X-direction partition pattern is 50% to 90% in a side adjacent to a pixel.

4. The color filter according to claim 1, wherein the partition pattern contains a light blocking agent.

5. The color filter according to claim 1, wherein an optical density of the X-direction partition pattern is 2 or more.

6. The color filter according to claim 1, wherein the Y-direction partition pattern contains an ink-repellent material.

7. A liquid crystal display device comprising the color filter according to claim 1.

\* \* \* \* \*